(12) United States Patent
Tilton et al.

(10) Patent No.: US 7,743,619 B1
(45) Date of Patent: Jun. 29, 2010

(54) HEAT EXCHANGER SYSTEM

(75) Inventors: Charles L. Tilton, Colton, WA (US);
Philip W. Appel, Spokane, WA (US)

(73) Assignee: Isothermal Research Systems, Inc.,
Liberty Lake, WA (US)

( * ) Notice: Subject to any disclaimer, the term of this patent is extended or adjusted under 35 U.S.C. 154(b) by 1139 days.

(21) Appl. No.: 11/327,181

(22) Filed: Jan. 6, 2006

(51) Int. Cl.
*F25D 23/12* (2006.01)
(52) U.S. Cl. ............................. 62/259.2; 62/310
(58) Field of Classification Search ............... 62/259.2, 62/310; 361/688, 699
See application file for complete search history.

(56) References Cited

U.S. PATENT DOCUMENTS

| | | | |
|---|---|---|---|
| 5,131,233 A * | 7/1992 | Cray et al. ............... | 62/64 |
| 5,907,473 A * | 5/1999 | Przilas et al. ............ | 361/699 |
| 6,849,554 B2 * | 2/2005 | Rattner et al. ............ | 438/706 |
| 6,880,350 B2 * | 4/2005 | Tilton ....................... | 62/171 |
| 6,976,528 B1 * | 12/2005 | Tilton et al. ............. | 165/104.33 |

* cited by examiner

*Primary Examiner*—Melvin Jones
(74) *Attorney, Agent, or Firm*—Michael S. Neustel

(57) ABSTRACT

A heat exchanger system for efficiently thermally managing coolant within a multiple-phase thermal management system. The heat exchanger system includes a thermal management unit, a release valve within the thermal management unit to release vaporized coolant, and a heat exchanger fluidly connected to the release valve and to the thermal management unit to return liquid coolant to the thermal management unit.

53 Claims, 9 Drawing Sheets

HEAT EXCHANGER SYSTEM

STATEMENT REGARDING FEDERALLY SPONSORED RESEARCH OR DEVELOPMENT

This invention was made with Government support under Contract No. DAAE30-95-C-0009 awarded by the U.S. Army. The Government has certain rights in this invention.

CROSS REFERENCE TO RELATED APPLICATIONS

Not applicable to this application.

BACKGROUND OF THE INVENTION

1. Field of the Invention

The present invention relates generally to multiple-phase thermal management systems and more specifically it relates to a heat exchanger system for efficiently thermally managing coolant within a multiple-phase thermal management system.

2. Description of the Related Art

Any discussion of the prior art throughout the specification should in no way be considered as an admission that such prior art is widely known or forms part of common general knowledge in the field.

Modern electronic devices (e.g. microprocessors, circuit boards, power supplies and other electronic devices) have increased thermal management requirements. Conventional dry thermal management technology (e.g. fans, vents) simply is not capable of efficiently cooling modern high-end electronics. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board. Spray thermal management may be performed locally (i.e. where the chip is sprayed directly), globally (i.e. where the chip and surrounding electronics/boards are also sprayed), a combination of locally and globally, or in conjunction with air cooling or other cooling methods.

The coolant typically used within a multiple-phase thermal management system is a dielectric fluid (e.g. hydrofluorethers) having a low vaporization temperature at standard atmospheric pressure. One common brand of dielectric coolant for multiple-phase thermal management systems is manufactured by Minnesota Mining and Manufacturing Company (3M®) under the federally registered trademark Fluorinert®. Non-dielectric fluids may also be utilized within multiple-phase thermal management systems.

BRIEF SUMMARY OF THE INVENTION

In view of the foregoing disadvantages inherent in the known types of multiple-phase thermal management systems now present in the prior art, the present invention provides a new heat exchanger system wherein the same can be utilized for efficiently thermally managing coolant within a multiple-phase thermal management system.

The general purpose of the present invention, which will be described subsequently in greater detail, is to provide a new heat exchanger system that has many of the advantages of the multiple-phase thermal management systems mentioned heretofore and many novel features that result in a new heat exchanger system which is not anticipated, rendered obvious, suggested, or even implied by any of the prior art multiple-phase thermal management systems, either alone or in any combination thereof.

To attain this, the present invention generally comprises a thermal management unit, a release valve within the thermal management unit to release vaporized coolant, and a heat exchanger fluidly connected to the release valve and to the thermal management unit to return liquid coolant to the thermal management unit.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a heat exchanger system that will overcome the shortcomings of the prior art devices.

A second object is to provide a heat exchanger system for efficiently thermally managing coolant within a multiple-phase thermal management system.

Another object is to provide a heat exchanger system that passively rejects heat from a multiple-phase thermal management system.

An additional object is to provide a heat exchanger system that may be utilized within various types of multiple-phase thermal management systems including but not limited to spray cooling.

A further object is to provide a heat exchanger system that centralizes a heat exchanger for thermally managing and condensing coolant vapor.

Another object is to provide a heat exchanger system that is less expensive and utilizes less space.

A further object is to provide a heat exchanger system that allows for the usage of smaller fluid transfer pathways.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
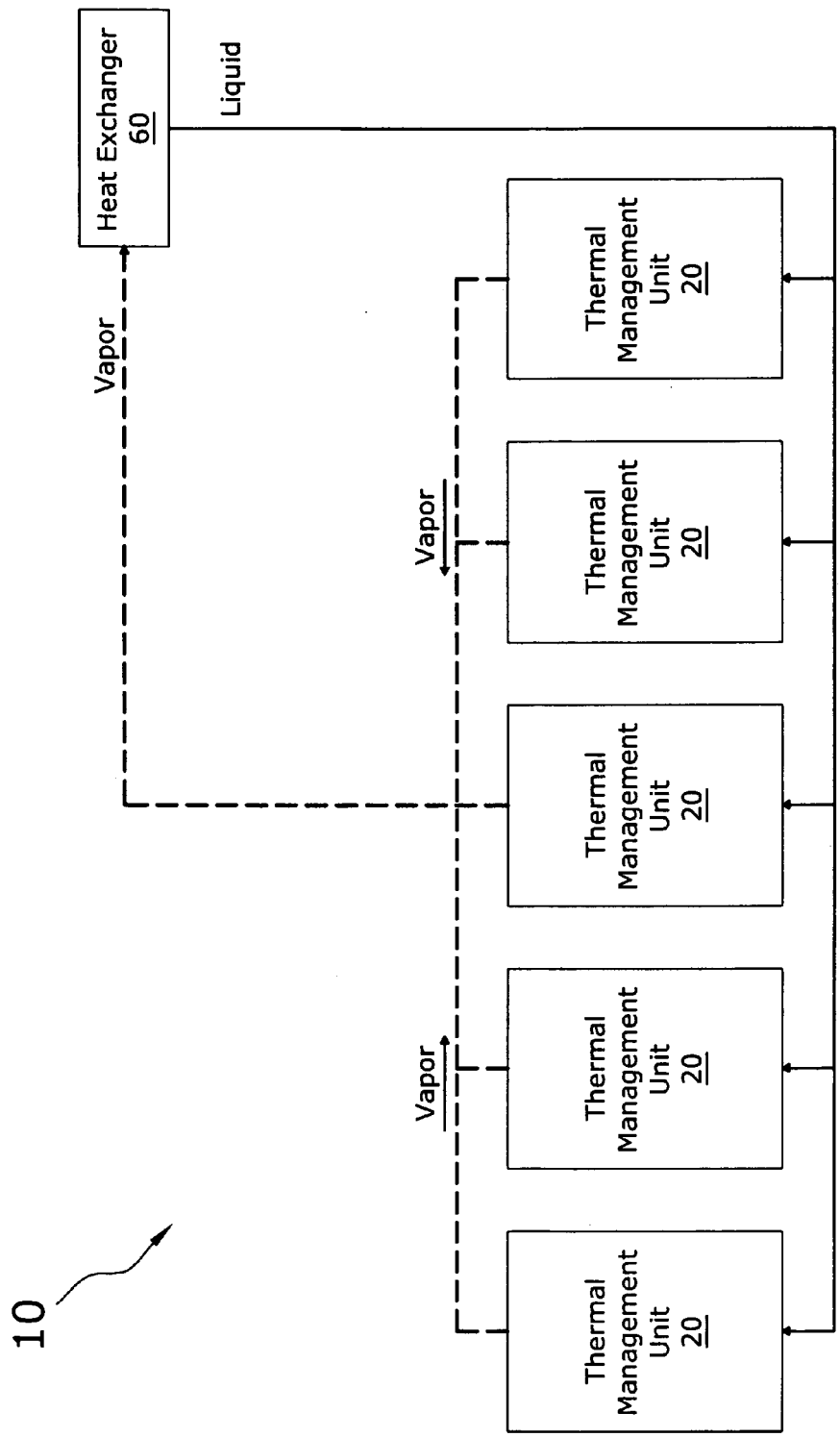
FIG. 1 is block diagram illustrating the present invention.

Turning now descriptively to the drawings, in which similar reference characters denote similar elements throughout the several views, FIGS. 1 through 9 illustrate a heat exchanger system 10, which comprises a thermal management unit 20, a release valve 40 within the thermal management unit 20 to release vaporized coolant, and a heat exchanger 60 fluidly connected to the release valve 40 and to the thermal management unit 20 to return liquid coolant to the thermal management unit 20.

B. Thermal Management Unit

FIGS. 1 through 8 illustrate one or more thermal management units 20. The present invention preferably is utilized with a plurality of thermal management units 20 connected together, however the present invention may be utilized with a single thermal management unit 20.

The thermal management unit 20 includes at least one cavity for receiving and thermally managing at least one heat producing device 12 (e.g. microprocessors, circuit boards, power supplies and other electronic devices). The thermal management unit 20 may utilized various types of multiphase (e.g. two-phase) thermal management technologies such as but not limited to spray cooling.

Figure 2:
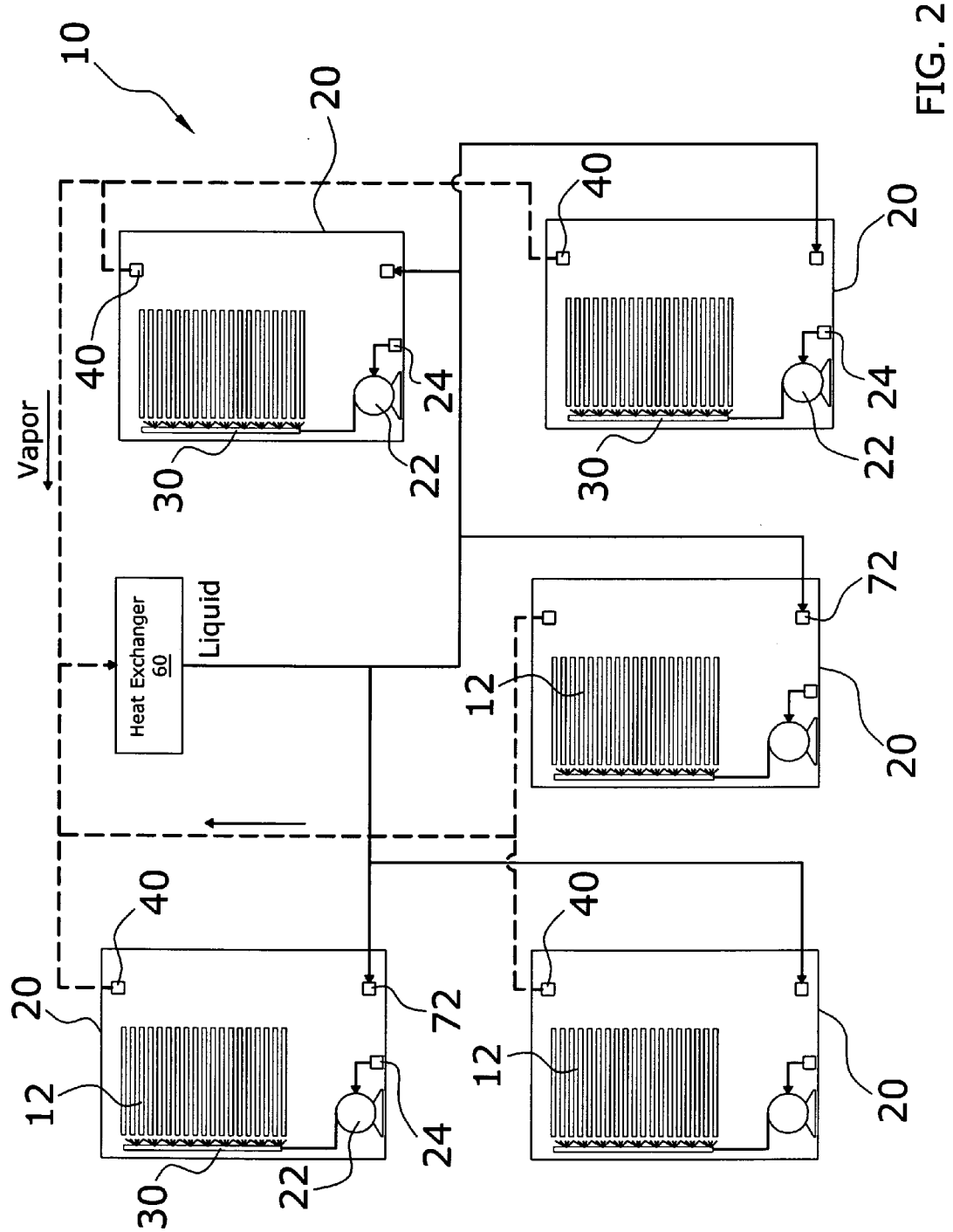
FIG. 2 is a detailed block diagram of the present invention.
Figure 4:
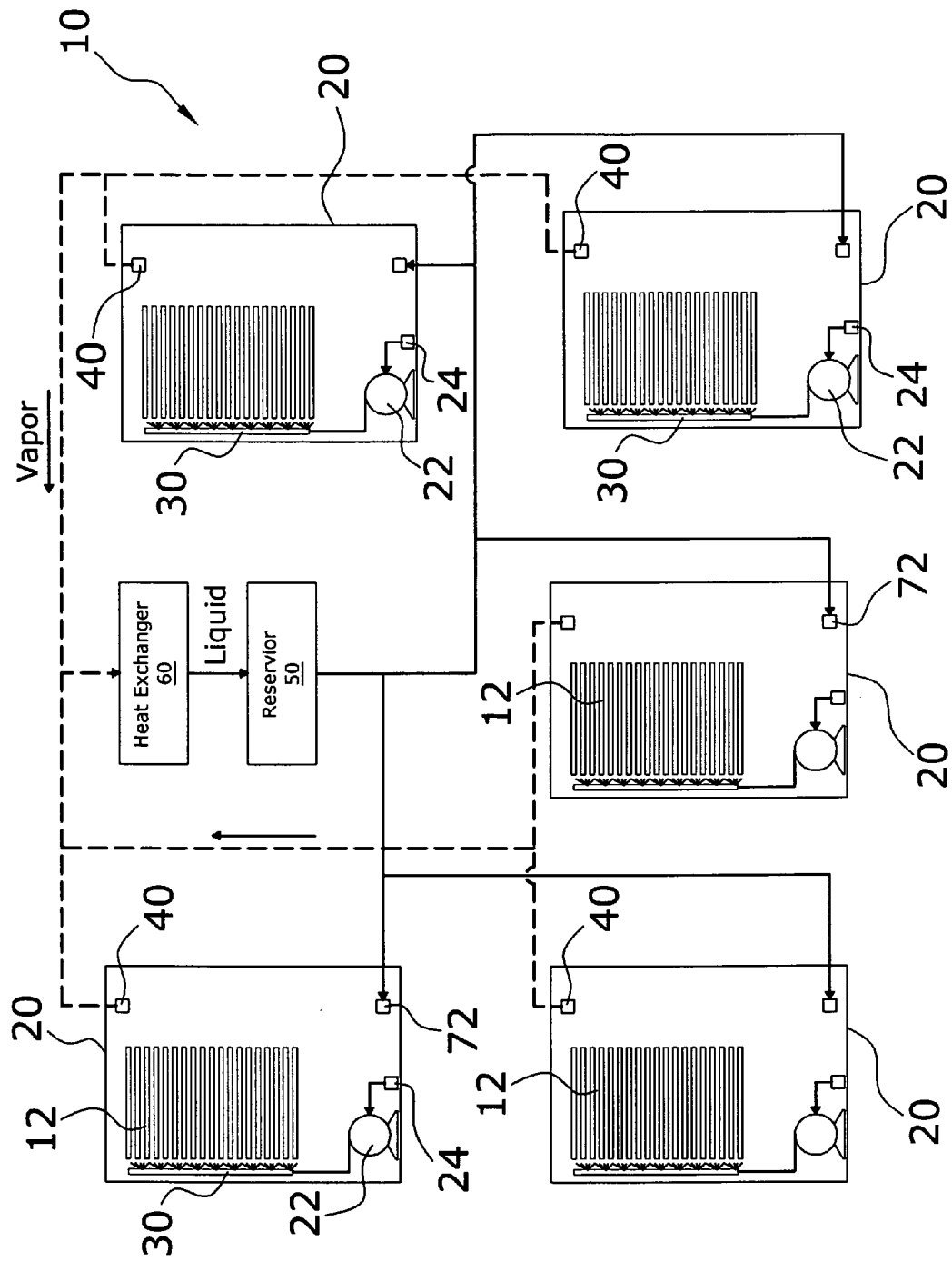
FIG. 4 is a detailed block diagram of the present invention with a reservoir fluidly connected to the heat exchanger.
Figure 6:
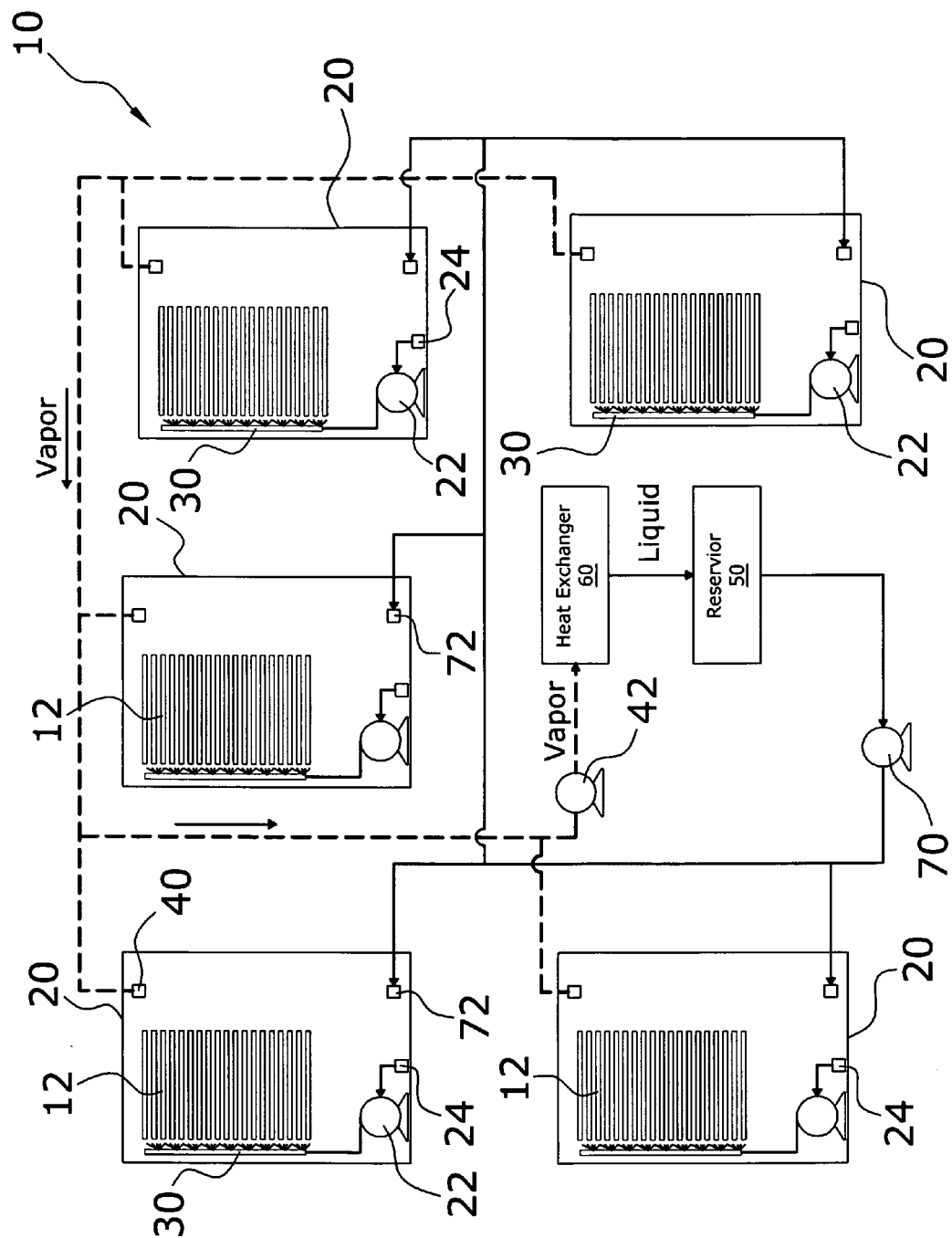
FIG. 6 is a detailed block diagram of the present invention with a reservoir and a vapor pump fluidly connected to the heat exchanger along with a return pump fluidly connected to the reservoir.

The present invention preferably utilizes spray cooling technology to thermally manage the heat producing device 12 within the thermal management unit 20. A spray unit 30 is preferably positioned within the thermal management unit 20 to spray liquid coolant upon the heat producing device 12 as illustrated in FIGS. 2, 4 and 6 of the drawings. A coolant pump 22 having an intake valve 24 or other pressurized fluid source is fluidly connected between the thermal management unit 20 and the spray unit 30 as further illustrated in FIGS. 2, 4 and 6 of the drawings. The coolant pump 22 provides pressurized liquid coolant that is sprayed upon the heat producing device 12 with a portion of the sprayed liquid coolant being vaporized. The vaporized coolant remains within the cavity of the thermal management unit 20 until released by the release valve 40.

U.S. Pat. No. 5,220,804 entitled High Heat Flux Evaporative Spray Cooling to Tilton et al. and U.S. Pat. No. 6,108,201 entitled Fluid Control Apparatus and Method for Spray Cooling to Tilton et al. are hereby incorporated by reference into this application for the purpose of further disclosing spray cooling technology. The coolant utilized within the present invention is a dielectric fluid (e.g. hydrofluorethers) or a non-dielectric having a relatively low vaporization temperature at standard atmospheric pressure.

C. Release Valve

The release valve 40 is fluidly connected to each thermal management unit 20 to selectively release vaporized coolant from within the thermal management unit 20 as illustrated in FIGS. 2, 4 and 6 of the drawings. The release valve 40 preferably releases only vaporized coolant from within the thermal management unit 20. It can be appreciated that the vaporized coolant released from the thermal management unit 20 by the release valve 40 may include a small portion of liquid coolant that is coincidentally carried within the vaporized coolant.

The vaporized coolant is preferably transferred from the thermal management unit 20 to the heat exchanger 60 via a passive transfer system as illustrated in FIGS. 1 through 4 of the drawings. A passive transfer system within the present invention is where the pressure within the thermal management unit 20 is sufficient to force the vaporized coolant out of the thermal management unit 20 though a conduit to the heat exchanger 60.

The release valve 40 is preferably automatically controlled by a central control unit (e.g. computer), however the release valve 40 may be manually controlled in certain situations. The release valve 40 may be comprised of a simple spring loaded valve that opens when sufficient pressure is exerted upon the valve. The release valve 40 has an open state to allow for the release of the vaporized coolant and a closed state to allow for the accumulation of the vaporized coolant within the thermal management unit 20. The release valve 40 may be comprised of any valve structure capable of opening and closing in a selective manner to retain and release a volume of pressurized vapor.

The release valve 40 may be controlled based upon various environmental conditions within the thermal management unit 20 such as but not limited to a pressure or a temperature within the thermal management unit 20. The release valve 40 is preferably closed when a pressure or a temperature within the thermal management unit 20 is below a minimum pressure or minimum temperature (e.g. a predetermined pressure or temperature, the current pressure or temperature within the heat exchanger 60, the current pressure or temperature within the reservoir 50, etc.). The release valve 40 is preferably opened when a pressure or temperature within the thermal management unit 20 is above the minimum pressure or temperature (or a second different pressure or second different temperature). The minimum pressure for the release valve 40 to be opened is a pressure required to passively allow a flow of the vaporized coolant from the thermal management unit 20 to the heat exchanger 60 to prevent a reversal of the vaporized coolant flow in the present invention.

Figure 5:
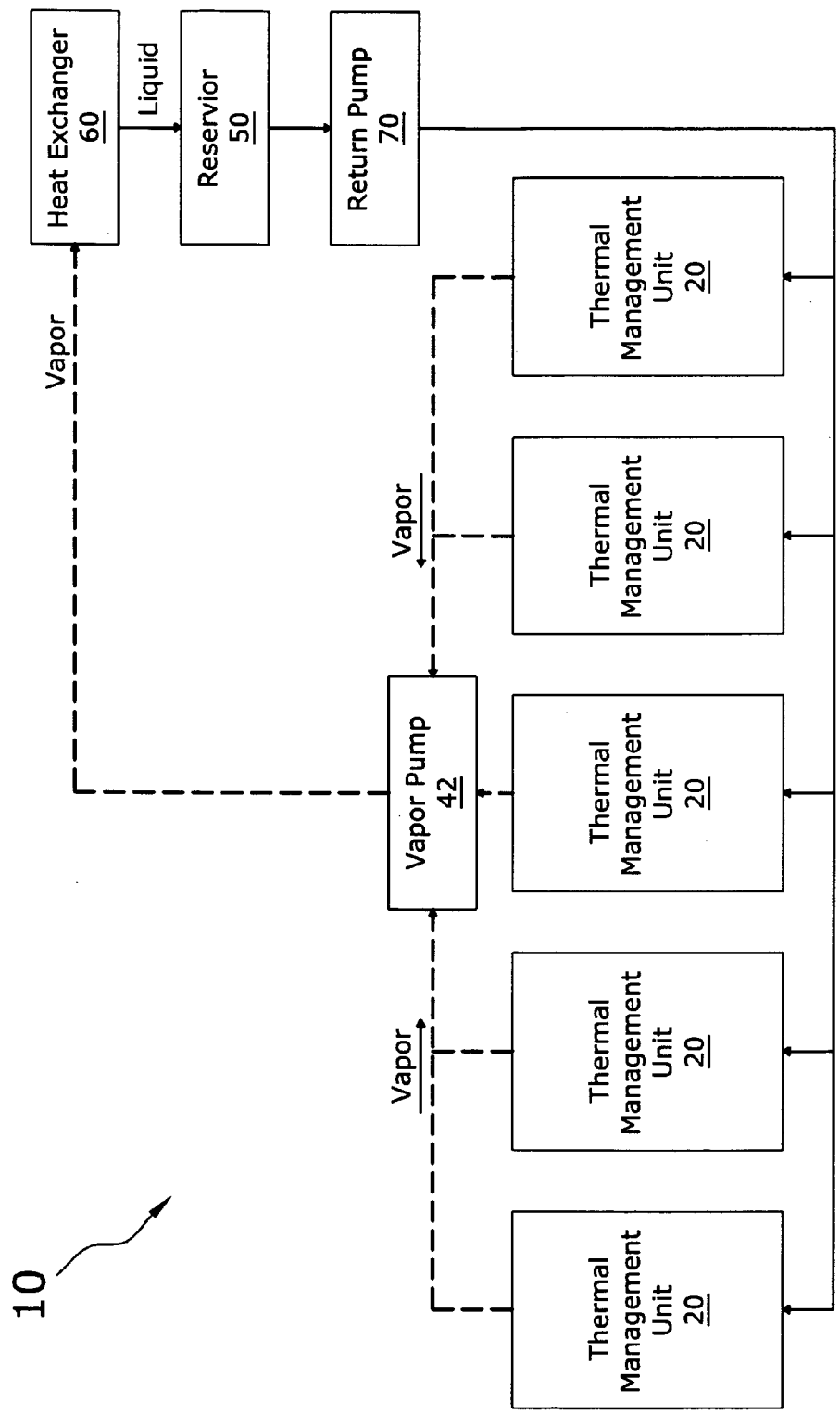
FIG. 5 is a block diagram of the present invention with a reservoir and a vapor pump fluidly connected to the heat exchanger along with a return pump fluidly connected to the reservoir.

FIGS. 5 and 6 illustrate an alternative embodiment utilizing a vapor pump 42 fluidly connected between the release valve 40 and the heat exchanger 60. The vapor pump 42 may be utilized in situations where the pressure within the thermal management unit 20 is not sufficient to allow for passive flowing of the vaporized coolant. It is preferable to utilize a single vapor pump 42 that collects the vaporized coolant from all of the thermal management units 20 as shown in FIGS. 5 and 6, however more than one vapor pump 42 may be utilized. In addition, the vapor pump 42 may be utilized instead of a release valve 40 to control the flow of coolant vapor from within the thermal management unit 20.

D. Heat Exchanger

FIGS. 1 through 9 illustrate the usage of an exemplary heat exchanger 60. The heat exchanger 60 is comprised of a phase change heat exchanger 60 capable of lowering the temperature of the vaporized coolant sufficiently to condense the same to liquid coolant (e.g. condenser).

The heat exchanger 60 has an inlet for receiving the vaporized coolant and an outlet for dispensing the condensed liquid coolant. As shown in FIGS. 1 through 4 of the drawings, the inlet of the heat exchanger 60 is fluidly connected to the release valve 40 of each thermal management unit 20 to receive the vaporized coolant from the same. As shown in FIGS. 5 and 6, a vapor pump 42 is fluidly connected between the heat exchanger 60 and the release valves 40.

As shown in FIGS. 1 and 2 of the drawings, the outlet of the heat exchanger 60 is fluidly connected to the thermal management unit 20 to return the condensed liquid coolant to the thermal management unit 20 to replace the vented vaporized coolant. The heat exchanger 60 is preferably positioned above a floor (or the fluid level) within the thermal management units 20 to allow liquid coolant to gravity feed from the heat exchanger 60 to the thermal management unit 20 in a passive manner as shown in FIGS. 1 and 2 of the drawings, but is not limited to such an arrangement for reasons stated below.

Figure 3:
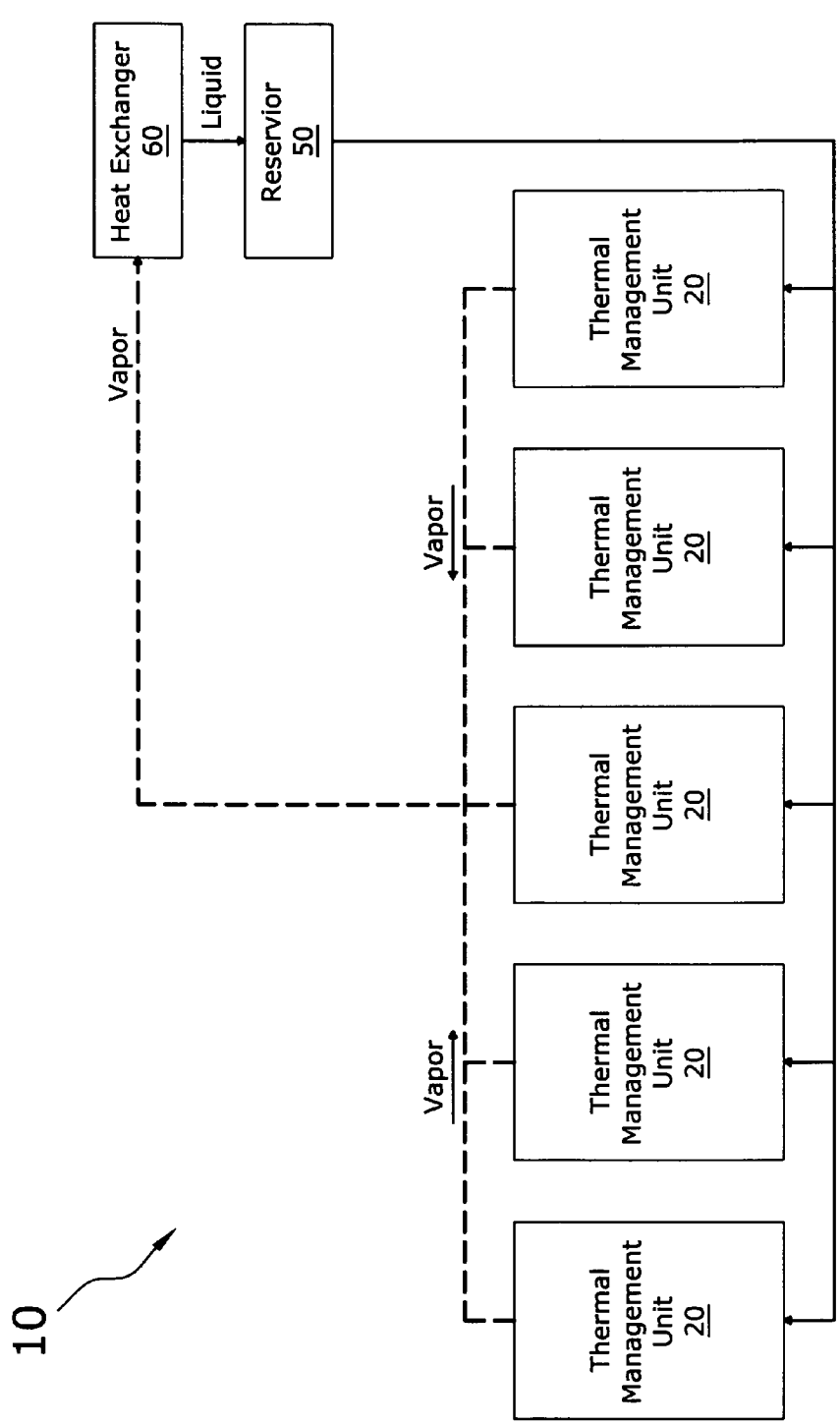
FIG. 3 is a block diagram of the present invention with a reservoir fluidly connected to the heat exchanger.

As shown in FIGS. 3 and 4 of the drawings, the outlet of the heat exchanger 60 is fluidly connected to a reservoir 50 which stores a volume of the condensed liquid coolant. As further shown in FIGS. 3 and 4 of the drawings, the reservoir 50 is fluidly connected to the thermal management units 20. As shown in FIGS. 5 and 6 of the drawings, the reservoir 50 is fluidly connected to an inlet of a return pump 70 which provides the liquid coolant back to the thermal management units 20.

E. Return Valve

FIGS. 2, 4 and 6 illustrate a return valve 72 fluidly connected to the thermal management units 20 to selectively return liquid coolant to the thermal management units 20 to substantially replace the vaporized coolant that has been vented through the release valve 40. The return valve 72 may be comprised of any valve capable of selectively controlling the flow of liquid coolant into the thermal management unit 20. FIG. 2 illustrates the return valve 72 fluidly connected directly to the outlet of the heat exchanger 60. FIG. 4 illustrates the return valve 72 fluidly connected directly to the reservoir 50. FIG. 6 illustrates the return valve 72 fluidly connected directly to the outlet of the return pump 70.

It is preferable that the return valve 72 assists in maintaining an approximate desired coolant level within the corresponding thermal management unit 20. The return valve 72 may be operated in conjunction with the release valve 40 to simultaneously (or at different times) replace the vaporized coolant vented through the release valve 40. For example, the return valve 72 may be opened simultaneously with the opening of the release valve 40 to allow a mass flow rate of liquid coolant into the thermal management unit 20 that is approximately equal to the mass flow rate of vaporized coolant leaving the thermal management unit 20 thereby maintaining a substantially constant coolant level (and/or pressure and/or temperature) at all times. The return valve 72 may be operated at a later time to compensate for the amount of vaporized coolant that has been vented through the release valve 40. The calculation of the mass flow rate and amounts of coolant that have passed through the release valve 40 and the return valve 72 is determined utilizing conventional sensors connected to a control unit (e.g. computer).

The return valve 72 may also be operated independently of the operation of the release valve 40. For example, the return valve 72 may operate based upon a measured coolant level within the thermal management unit 20. If the measured coolant level is below a desired coolant level, the return valve 72 is then opened to allow for the replacement of vented vaporized coolant. The return valve 72 remains open until approximately the desired coolant level (a specific level or a range) is returned to the thermal management unit 20. The return valve 72 preferably remains closed if the approximate desired coolant level (and/or desired pressure and/or desired temperature) within the thermal management unit 20 is achieved or if the current coolant level exceeds the desired coolant level.

As illustrated in FIGS. 1 through 4 of the drawings, it is preferable that the liquid coolant is transferred from the heat exchanger 60 (or from the reservoir 50) to the thermal management units 20 via gravity feed. However, a return pump 70 may be fluidly connected between the reservoir 50 (or the heat exchanger 60) and the thermal management units 20 as illustrated in FIGS. 5 and 6 of the drawings.

F. Reservoir

As shown in FIGS. 3 through 6 of the drawings, a reservoir 50 is preferably fluidly connected to the outlet of the heat exchanger 60 to collect the condensed liquid coolant. The reservoir 50 is further preferably fluidly connected to the thermal management units 20 (or to the return pump 70) as further shown in FIGS. 3 through 6 of the drawings. The reservoir 50 is preferably capable of retaining a desired volume of liquid coolant to ensure that each of the thermal management units 20 has sufficient liquid coolant during operations.

The reservoir 50 is preferably positioned below the heat exchanger 60 to allow liquid coolant to gravity feed from the heat exchanger 60 to the reservoir 50 as illustrated in FIGS. 4 through 9 of the drawings. However, the reservoir 50 may be above the heat exchanger 60 in situations where a pump is utilized between the same. The reservoir 50 is further preferably positioned above a floor (or the fluid level) within the thermal management units 20 to allow liquid coolant to gravity feed from the reservoir 50 to the thermal management unit 20 in a passive manner.

G. Single Valve (for Vapor Venting and Liquid Return)

Figure 7:
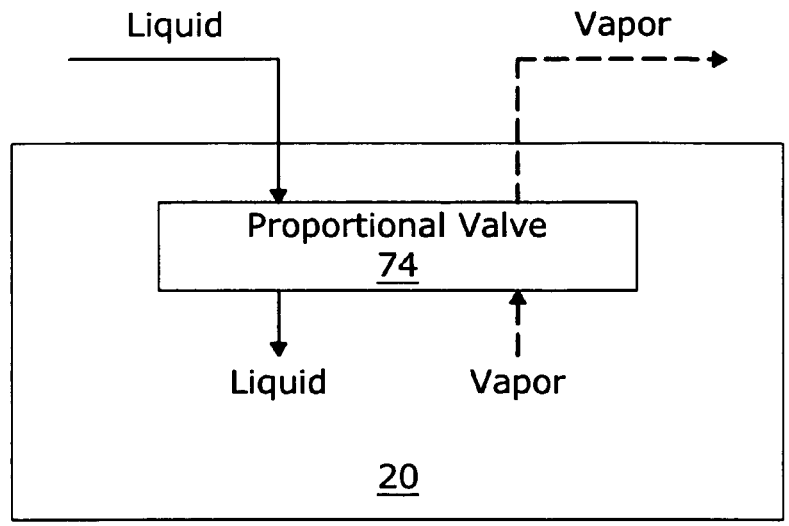
FIG. 7 is a block diagram illustrating a proportional valve utilized to control the flow of liquid into and vapor out of the thermal management unit.
Figure 8:
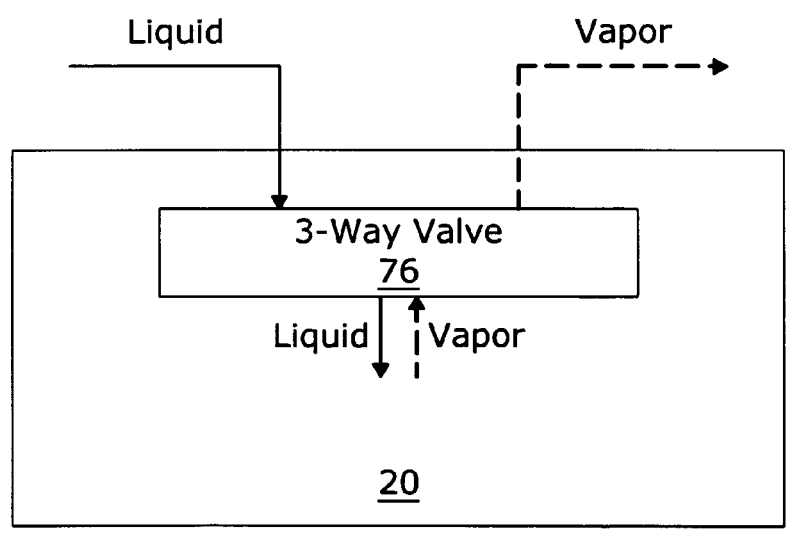
FIG. 8 is a block diagram illustrating a 3-way valve utilized to control the flow of liquid into and vapor out of the thermal management unit.
Figure 9:
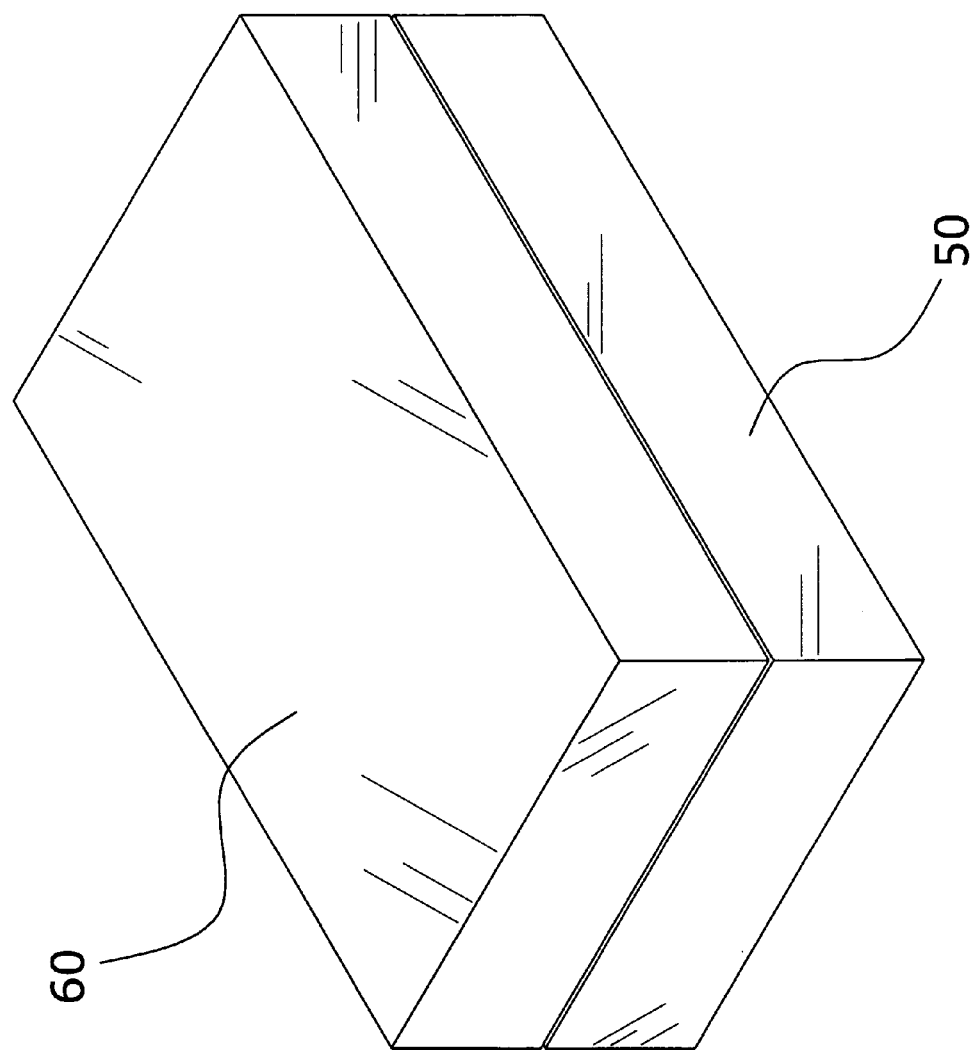
FIG. 9 is an upper perspective view illustrating the heat exchanger positioned above the reservoir to allow for gravity filling of the reservoir.
Figure 10:
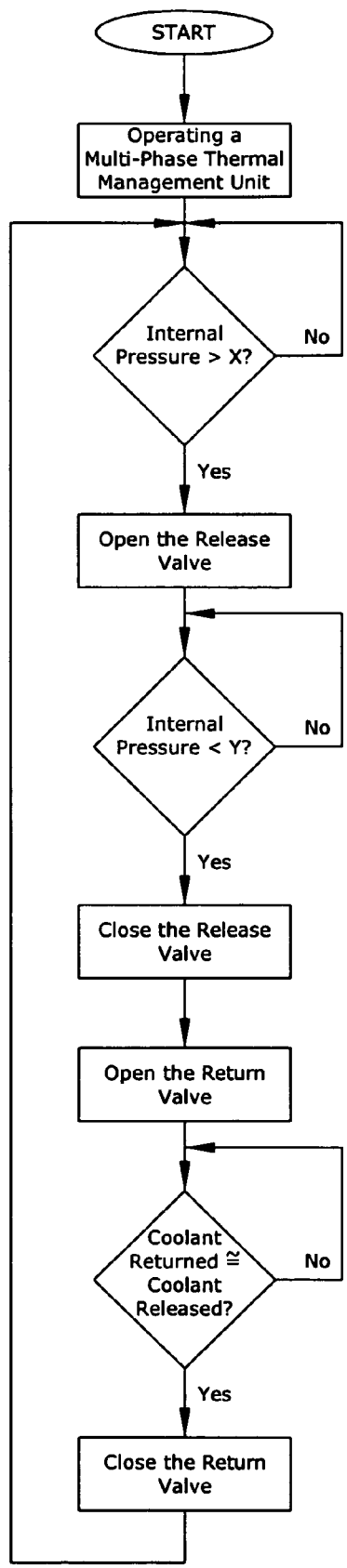
FIG. 10 is a flowchart illustrating the overall operation of the present invention.

A single valve 74, 76 may be utilized to control both the flow of the vaporized coolant and the liquid coolant from and into the thermal management unit 20 respectively as shown in FIGS. 7 and 8 of the drawings. The single valve 74, 76 is fluidly connected to the thermal management unit 20 to release the vaporized coolant and to return the liquid coolant. The single valve 74, 76 is fluidly connected to the inlet of the heat exchanger 60 (or vapor pump 42) for providing the vaporized coolant to the heat exchanger 60 for condensing.

Various types of valves may be utilized to construct the single valve, however a proportional valve 74 (FIG. 7) and a 3-way valve 76 (FIG. 8) will be discussed.

As shown in FIG. 7 of the drawings, the proportional valve 74 is utilized to substantially simultaneously release the vaporized coolant to the heat exchanger 60 and return the liquid coolant from the heat exchanger 60 at corresponding mass flow rates. More particularly, a first mass flow rate of the vaporized coolant released from the thermal management unit 20 approximately equals a second mass flow rate of the liquid coolant returning to the thermal management unit 20. A coolant level sensor may be utilized to ensure that the proportional valve 74 is operating properly and accurately. A proportional valve 74 requires a separate entrance for the vaporized coolant and a separate exit for the returning liquid coolant as illustrated in FIG. 7.

As shown in FIG. 8 of the drawings, the 3-way valve 76 releases the vaporized coolant to the heat exchanger 60 and then returns the liquid coolant from the heat exchanger 60 (or vice versa). The 3-way valve 76 preferably has a common entrance for the vaporized coolant and exit for the returning liquid coolant as illustrated in FIG. 8.

H. Operation of Present Invention

In use, the heat producing devices 12 are operated as normal and the multi-phase thermal management process (e.g. spray cooling) is utilized to thermally manage the heat producing devices 12. As the liquid coolant is vaporized within the thermal management unit 20, the vaporized coolant is accumulated within the cavity of the thermal management unit 20 (and/or a separate vapor cavity). Once the internal pressure within the thermal management unit 20 has exceeded a first level (e.g. a predetermined pressure, the current pressure in the heat exchanger 60, the current pressure in the reservoir 50), the vaporized coolant is thereafter passively released to the heat exchanger 60 by the opening of the release valve 40 under its own pressure as illustrated in FIGS. 1 through 4 of the drawings. FIGS. 5 and 6 illustrate utilizing a vapor pump 42 to actively transfer the vaporized coolant from the thermal management units 20 to the heat exchanger 60. Once the internal pressure within the thermal management unit 20 has fallen below a second level (e.g. a predetermined pressure), the release valve 40 is then closed to prevent the passage of the vaporized coolant. The return valve 72 is then opened (or simultaneously within the release valve 40) to replace the vented vaporized coolant by either filling the thermal management unit 20 to a desired coolant level or by replacing the total mass of the vented vaporized coolant with a substantial equivalent total mass of liquid coolant. Alternatively, the return valve 72 may be opened to achieve a corresponding mass flow rate as the release valve 40 (or the proportional valve 74 is operated accordingly). This process is repeated throughout the thermal management process.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A thermal management system for thermally managing one or more heat producing electronic devices, comprising:
   a thermal management unit;
   a release valve fluidly connected to said thermal management unit to selectively release a coolant from within said thermal management unit, wherein said coolant is in a substantially vaporized state; and
   a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
   wherein said release valve is opened and closed based upon an environmental condition of said thermal management unit;
   wherein vaporized coolant is transferred from said thermal management unit to said heat exchanger via a passive transfer system.

2. The thermal management system of claim 1, wherein said thermal management unit includes a spray unit to spray liquid coolant upon the heat producing device.

3. The thermal management system of claim 2, including a pump fluidly connected between said thermal management unit and said spray unit.

4. The thermal management system of claim 1, including a return valve fluidly connected between said heat exchanger and said thermal management unit to control a flow of liquid coolant to said thermal management unit.

5. The thermal management system of claim 4, wherein said return valve is closed when a desired coolant level exists within said thermal management unit.

6. The thermal management system of claim 4, wherein said return valve is open when a desired coolant level does not exist within said thermal management unit.

7. The thermal management system of claim 4, wherein said return valve is opened to approximately replace the coolant vented through said release valve.

8. The thermal management system of claim 1, including a vapor pump fluidly connected between said release valve and said heat exchanger.

9. The thermal management system of claim 1, wherein said release valve is closed when a pressure within said thermal management unit is below a minimum pressure and wherein said release valve is open when a pressure within said thermal management unit is above said minimum pressure.

10. The thermal management system of claim 9, wherein said minimum pressure is a pressure required to cause a flow of the vaporized coolant from said thermal management unit to said heat exchanger.

11. The thermal management system of claim 1, wherein said release valve is closed when a temperature within said thermal management unit is below a minimum temperature and wherein said release valve is open when a temperature within said thermal management unit is above said minimum temperature.

12. The thermal management system of claim 1, including a reservoir fluidly connected between said heat exchanger and said thermal management unit.

13. The thermal management system of claim 12, wherein said reservoir is positioned below said heat exchanger to allow liquid coolant to gravity feed from said heat exchanger to said reservoir.

14. The thermal management system of claim 13, wherein said reservoir is positioned above a floor within said thermal management unit to allow liquid coolant to gravity feed from said reservoir to said thermal management unit.

15. The thermal management system of claim 12, including a return pump fluidly connected between said reservoir and said thermal management unit.

16. The thermal management system of claim 1, including a return pump fluidly connected between said heat exchanger and said thermal management unit.

17. The thermal management system of claim 1, wherein liquid coolant is transferred from said heat exchanger to said thermal management unit via gravity feed.

18. A thermal management system for thermally managing one or more heat producing electronic devices, comprising:
   a plurality of thermal management units;
   a plurality of release valves fluidly connected respectively to said plurality of thermal management units to selectively release a coolant from within said plurality of thermal management units, wherein said coolant is in a substantially vaporized state; and
   a heat exchanger having an inlet and an outlet, wherein said inlet of said heat exchanger is fluidly connected to said plurality of release valves to receive the vaporized coolant and wherein said outlet is fluidly connected to said plurality of thermal management units to return liquid coolant to said plurality of thermal management units.

19. The thermal management system of claim 18, wherein each of said plurality of thermal management units includes a spray unit to spray liquid coolant upon the heat producing device.

20. The thermal management system of claim 19, wherein each of said plurality of thermal management units includes a pump fluidly connected to said spray unit.

21. The thermal management system of claim 18, including a plurality of return valves fluidly connected between said heat exchanger and said plurality of thermal management units to control a flow of liquid coolant to said plurality of thermal management units.

22. The thermal management system of claim 21, wherein said return valves are closed when a desired coolant level exists within a corresponding thermal management unit.

23. The thermal management system of claim 21, wherein said return valves are open when a desired coolant level does not exist within a corresponding thermal management unit.

24. The thermal management system of claim 21, wherein said return valves are opened to approximately replace the coolant vented through said release valve.

25. The thermal management system of claim 18, wherein vaporized coolant is transferred from said plurality of thermal management units to said heat exchanger via a passive transfer system.

26. The thermal management system of claim 18, including at least one vapor pump fluidly connected between said release valves and said heat exchanger.

27. The thermal management system of claim 16, wherein said release valves are opened and closed based upon an environmental condition of a corresponding thermal management unit.

28. The thermal management system of claim 27, wherein said release valves are closed when a pressure within a corresponding thermal management unit is below a minimum pressure and wherein said release valves are open when a pressure within said corresponding thermal management unit is above said minimum pressure.

29. The thermal management system of claim 28, wherein said minimum pressure is a pressure required to cause a flow of the vaporized coolant from said thermal management unit to said heat exchanger.

30. The thermal management system of claim 27, wherein said release valves are closed when a temperature within a corresponding thermal management unit is below a minimum temperature and wherein said release valves are open when a temperature within said corresponding thermal management unit is above said minimum temperature.

31. The thermal management system of claim 18, including a reservoir fluidly connected between said heat exchanger and said plurality of thermal management units.

32. The thermal management system of claim 31, wherein said reservoir is positioned below said heat exchanger to allow liquid coolant to gravity feed from said heat exchanger to said reservoir.

33. The thermal management system of claim 32, wherein said reservoir is positioned above a floor within each of said plurality of thermal management units to allow liquid coolant to gravity feed from said reservoir to said plurality of thermal management units.

34. The thermal management system of claim 31, including a return pump fluidly connected between said reservoir and said plurality of thermal management units.

35. The thermal management system of claim 18, including a return pump fluidly connected between said heat exchanger and said plurality of thermal management units.

36. The thermal management system of claim 18, wherein liquid coolant is transferred from said heat exchanger to said plurality of thermal management units via gravity feed.

37. A thermal management system for thermally managing one or more heat producing devices, comprising:
   a thermal management unit;
   a heat exchanger having an inlet and an outlet; and
   a valve fluidly connected to said thermal management unit, to said inlet and to said outlet, wherein said valve selectively releases substantially vaporized coolant from within said thermal management unit to said heat exchanger and wherein said valve selectively returns liquid coolant from said heat exchanger to said thermal management unit;
   wherein said valve is comprised of a proportional valve to simultaneously release the vaporized coolant to said heat exchanger and return the liquid coolant from said heat exchanger.

38. The thermal management system of claim 37, wherein a first mass flow rate of the vaporized coolant approximately equals a second mass flow rate of the liquid coolant.

39. A method of thermally conditioning coolant within a thermal management unit, said method comprising:
   accumulating vaporized coolant within a thermal management unit;
   releasing at least a portion of said vaporized coolant when an internal pressure or an internal temperature within said thermal management unit exceeds a first level;
   terminating said step of releasing when said internal pressure or said internal temperature is below a second level;
   returning liquid coolant from a heat exchanger to said thermal management unit until the released vaporized coolant has been substantially replaced.

40. A method of thermally conditioning coolant within a thermal management unit, said method comprising:
   accumulating vaporized coolant within a thermal management unit;
   releasing at least a portion of said vaporized coolant having a first mass flow rate when an internal pressure within said thermal management unit exceeds a first level; and
   returning liquid coolant from a heat exchanger to said thermal management unit having a second mass flow rate, wherein said second mass flow rate is substantially equal to said first mass flow rate.

41. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
  a return valve fluidly connected between said heat exchanger and said thermal management unit to control a flow of liquid coolant to said thermal management unit, wherein said return valve is closed when a desired coolant level exists within said thermal management unit.

42. A thermal management system for thermally managing one or more heat producing devices, comprising:
  a thermal management unit;
  a heat exchanger having an inlet and an outlet; and
  a valve fluidly connected to said thermal management unit, to said inlet and to said outlet, wherein said valve selectively releases substantially vaporized coolant from within said thermal management unit to said heat exchanger and wherein said valve selectively returns liquid coolant from said heat exchanger to said thermal management unit;
  wherein said valve is comprised of a 3-way valve to release the vaporized coolant to said heat exchanger and to return the liquid coolant from said heat exchanger.

43. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
  wherein said release valve is opened and closed based upon an environmental condition of said thermal management unit;
  a return valve fluidly connected between said heat exchanger and said thermal management unit to control a flow of liquid coolant to said thermal management unit, wherein said return valve is closed when a desired coolant level exists within said thermal management unit.

44. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
  wherein said release valve is opened and closed based upon an environmental condition of said thermal management unit;
  a return valve fluidly connected between said heat exchanger and said thermal management unit to control a flow of liquid coolant to said thermal management unit, wherein said return valve is open when a desired coolant level does not exist within said thermal management unit.

45. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
  wherein said release valve is opened and closed based upon an environmental condition of said thermal management unit;
  a return valve fluidly connected between said heat exchanger and said thermal management unit to control a flow of liquid coolant to said thermal management unit, wherein said return valve is opened to approximately replace the coolant vented through said release valve.

46. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
  wherein said release valve is opened and closed based upon an environmental condition of said thermal management unit, wherein said release valve is closed when a pressure within said thermal management unit is below a minimum pressure and wherein said release valve is open when a pressure within said thermal management unit is above said minimum pressure.

47. The thermal management system of claim 46, wherein said minimum pressure is a pressure required to cause a flow of the vaporized coolant from said thermal management unit to said heat exchanger.

48. A thermal management system for thermally managing one or more heat producing electronic devices, comprising:
  a thermal management unit;
  a release valve fluidly connected to said thermal management unit to selectively release a coolant from within said thermal management unit, wherein said coolant is in a substantially vaporized state; and
  a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;

wherein said release valve is opened and closed based upon an environmental condition of said thermal management unit, wherein said release valve is closed when a temperature within said thermal management unit is below a minimum temperature and wherein said release valve is open when a temperature within said thermal management unit is above said minimum temperature.

49. A thermal management system for thermally managing one or more heat producing electronic devices, comprising:
- a thermal management unit;
- a release valve fluidly connected to said thermal management unit to selectively release a coolant from within said thermal management unit, wherein said coolant is in a substantially vaporized state;
- a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
- wherein said release valve is opened and closed based upon an environmental condition of said thermal management unit; and
- a reservoir fluidly connected between said heat exchanger and said thermal management unit.

50. The thermal management system of claim 49, wherein said reservoir is positioned below said heat exchanger to allow liquid coolant to gravity feed from said heat exchanger to said reservoir.

51. The thermal management system of claim 50, wherein said reservoir is positioned above a floor within said thermal management unit to allow liquid coolant to gravity feed from said reservoir to said thermal management unit.

52. The thermal management system of claim 49, including a return pump fluidly connected between said reservoir and said thermal management unit.

53. A thermal management system for thermally managing one or more heat producing electronic devices, comprising:
- a thermal management unit;
- a release valve fluidly connected to said thermal management unit to selectively release a coolant from within said thermal management unit, wherein said coolant is in a substantially vaporized state;
- a heat exchanger having an inlet and an outlet, wherein said inlet of said heat exchanger is fluidly connected to said release valve to receive the vaporized coolant and wherein said outlet is fluidly connected to said thermal management unit to return liquid coolant to said thermal management unit;
- wherein said release valve is opened and closed based upon an environmental condition of said thermal management unit; and
- a return pump fluidly connected between said heat exchanger and said thermal management unit.

* * * * *